(12) United States Patent
Caruba

(10) Patent No.: US 7,468,509 B2
(45) Date of Patent: Dec. 23, 2008

(54) ELECTRICAL INTERCONNECTION STRUCTURE FOR DIVERSE SIGNALS

(75) Inventor: James Frank Caruba, Bartlett, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 297 days.

(21) Appl. No.: 11/504,248

(22) Filed: Aug. 14, 2006

(65) Prior Publication Data

US 2008/0035838 A1 Feb. 14, 2008

(51) Int. Cl.
*G01R 23/02* (2006.01)
(52) U.S. Cl. .................................................. 250/250
(58) Field of Classification Search ............... 250/250, 250/252.1, 363.09, 303, 369
See application file for complete search history.

(56) References Cited

U.S. PATENT DOCUMENTS

| | | | |
|---|---|---|---|
| 3,011,057 A | 11/1961 | Anger | |
| 4,507,733 A * | 3/1985 | Blum | 250/363.09 |
| 6,124,595 A | 9/2000 | Engdahl et al. | |
| 2002/0052146 A1 * | 5/2002 | Custer et al. | 439/625 |
| 2004/0036026 A1 | 2/2004 | Engdahl et al. | |
| 2005/0148084 A1 * | 7/2005 | Parce et al. | 436/50 |

* cited by examiner

*Primary Examiner*—David P Porta
*Assistant Examiner*—Faye Boosalis
(74) *Attorney, Agent, or Firm*—Peter L. Kendall

(57) ABSTRACT

A single interconnection unit provides all of the signal connections required to operate a group of PMTs and to transmit signals therefrom to acquisition electronics exterior to an enclosure for the PMTs in a nuclear scanner. In a preferred embodiment, the interconnection unit provides a shielded differential pair connection for RF signals; power supply connections for the PMTs, providing all of the voltages required to operate PMTs and the associated circuits, as well as connections for those signals and appropriate ground planes. Preferably, interconnection unit comprises a flex circuit with end connectors designed to connect to a power supply unit and an acquisition unit remote from the PMTs. Connection points are provided along the length of the flexible circuit for connection to a PMT and provide all of the necessary connections for that PMT, including shared power supplies and ground buses, as well as connections dedicated to a particular PMT, including a dedicated RF differential pair, a dedicated digital line, and an associated ground plane.

31 Claims, 8 Drawing Sheets

ELECTRICAL INTERCONNECTION STRUCTURE FOR DIVERSE SIGNALS

BACKGROUND

1. Field of the Invention

The present invention relates generally to electrical interconnection structures, and more particularly, concerns an interconnection structure capable of providing connections for diverse signals among a plurality of units.

2. Background of the Invention

There are several distinct types of imaging systems utilized in contemporary nuclear medicine. One type may employ gamma scintillation cameras (GSCs), so-called "position sensitive" continuous-area detectors, or simply, nuclear detectors. An exemplary GSC is a single photon emission computed tomography (SPECT) scanner. Another type of imaging system involves computed tomography ("CT") of X-ray imaging. In contrast, magnetic resonance imaging (MRI) visualizes the inside of living organisms by making use of the relaxation properties of excited hydrogen nuclei in water placed in a powerful, uniform magnetic field.

Gamma rays are an energetic form of electromagnetic radiation produced by radioactive decay or other nuclear or subatomic processes such as electron-positron annihilation. Gamma rays form the highest-energy end of the electromagnetic spectrum. They are often defined to begin at an energy of 10 keV, a frequency of 2.42 EHz, or a wavelength of 124 pm, although electromagnetic radiation from around 10 keV to several hundred keV is also referred to as hard X-rays.

Gamma scintillation cameras, GSCs, are primarily used to measure gamma events produced by very low-level radioactive materials (called radionuclides or radio-pharmaceuticals) that have been ingested by, or injected into, a patient. The signals from the GSCs are used to generate images of the anatomy of organs, bones or tissues of the body and/or to determine whether an organ is functioning properly. The radiopharmaceuticals are specially formulated to collect temporarily in a certain part of the body to be studied, such as the patient's heart or brain. Once the radio-pharmaceuticals reach the intended organ, they emit gamma rays that are then detected and measured by the GSCs. Nuclear detectors perform spectroscopy and event X/Y positioning by processing signals from a constellation of Photo-multiplier Tubes (PMTs). One current series of detectors contains 59 PMTs.

To guard against the deleterious effects of stray X-rays blinding the scintillation crystal and the PMTs and possibly damaging the associated electronics, a GSC has a lead enclosure, i.e., tub, to block the stray X-rays. Furthermore, because the scintillation crystal emits faint amounts of light upon scintillation, the interior of the GSC must be shielded from ambient light that would blind the photosensors in the GSC used to measure the scintillation light emissions.

Owing to the large number of interconnections between PMT preamplifiers and an acquisition electronics system, portions of the acquisition electronics system have typically been packaged inside the tub. Because these connections generate heat, a significant amount of heat accumulates in the tub, detrimentally affecting the GSC's reliability. Likewise, the connections involve numerous printed circuit boards (PCBs) and cables, which must be disassembled to access a PMT needing replacement, making the GSC hard to service. Similarly, because the detectors need to be built in test stands, disassembled and then reassembled in the tubs, this arrangement of the connections compounds the effort needed to manufacture the GSCs.

While this arrangement has been functional, reliability, serviceability and manufacturability would all benefit if the electronics could be relocated outside of the tub. For these electronics to be placed outside the tub, an electrical penetration of the tub must support all of the PMT interconnections, including high and low voltage power supply voltages, balanced (differential pair) RF signals, and a serial data stream for analog-to-digital converters.

SUMMARY

In accordance with embodiments of the present invention, a single interconnection unit provides all of the signal connections required to operate the PMTs and to transmit signals therefrom to exterior circuitry (the acquisition electronics). In a preferred embodiment, the interconnection unit provides a shielded balanced differential pair connection for RF signals to exterior circuitry, as well as power supply connections for the PMTs, thus is providing all of the voltages required to operate PMTs and the associated circuits, as well as connections for those signals and appropriate ground planes. Preferably, the interconnection unit comprises a flex circuit with an end connector design to connect to a power supply unit and a processing unit remote from the PMTs. Connection points are provided along the length of the flexible circuit for connection of a PMT and provide all of the necessary connections for that PMT, including shared power supplies and ground buses, as well as connections dedicated to a particular PMT, including a dedicated RF differential pair, a dedicated digital line, and an associated ground plane.

BRIEF DESCRIPTION OF THE DRAWINGS

The foregoing brief description and further objects, features, and advantages of the embodiments of the present invention will be understood more completely from the following detailed description of a presently preferred, but nonetheless illustrative, embodiment, with reference being had to the accompanying drawing in which.

DETAILED DESCRIPTION OF EXEMPLARY EMBODIMENTS

In accordance with one or more other embodiments of the present invention, an apparatus may comprise means for electrically connecting a plurality of photo-multiplier tubes inside of a tub enclosure of a nuclear detector and an acquisition electronics system outside of the tub enclosure and also providing power supply connectors to the interior of the tub. The means for electrically connecting may include means for electrically interconnecting the plurality of PMTs. The means for electrically interconnecting the plurality of PMTs may include a high-density configuration of interconnection circuitry.

For illustrative purposes, the present invention will be described in terms of an interconnection structure for a single photon emission computed tomography (SPECT) scanner for nuclear medicine applications.

Figure 1:
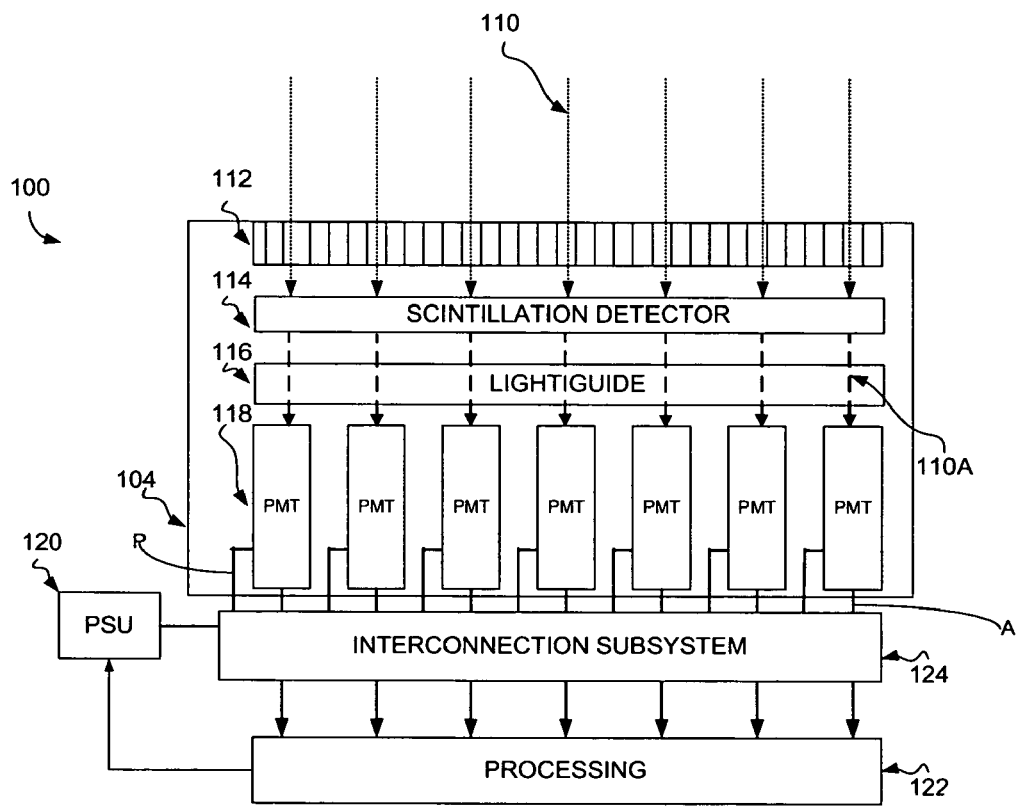
FIG. 1 is a schematic block diagram illustrating exemplary Gamma ray detection circuitry of a SPECT scanner as the environment for an embodiment in accordance with the present invention.

FIG. 1 is a block diagram depicting a gamma ray detection circuit of the SPECT scanner 100. Portions of the gamma ray detection circuitry are similar to those of Anger, U.S. Pat. No. 3,011,057, the entire disclosure of which is incorporated herein by reference. In particular, the gamma ray detection circuit includes a parallel hole collimator 112, a scintillation detector (crystal) 114, a light guide 116, a plurality of photo multiplier tubes (PMTs) 118, a high voltage power supply 120 for the PMTs 118, and an acquisition electronics system 122 for processing the data from the PMTs 118. Interconnection circuitry 124 is used to connect the PMTs 118 to the power supply unit (PSU) 120 and the acquisition electronics system 122.

The parallel hole collimator 112 acts as a guide to channel the gamma rays 110 through the tub 104 to the scintillation crystal 114. The scintillation crystal 114 functions as a gamma ray detector by converting the high-energy photons of the gamma rays 110 into visible light (i.e., lower energy photons). When a gamma ray 110 strikes and is absorbed in the scintillation crystal 114, the energy of the gamma ray 110 is converted into flashes of light 110A (i.e., a large number of scintillation photons) that emanate and spread from the point at which the gamma ray 110 is absorbed. The scintillation crystal 114 may be formed from any suitable materials known in the art, such as sodium iodide doped with a trace of thallium (NaI(TI)) or CsI(TI). The scintillation photons 110A emitted from the scintillation crystal 114 are typically in the visible light region of the electromagnetic spectrum (and may have a mean value of about 3 eV for NaI(TI)).

The light guide 116 assists in focusing the scintillation photons 110A from the scintillation crystal 114 to the PMTs 118. The plurality of PMTs 118 is located adjacent to the light guide 116. In one or more embodiments, the number of PMTs may be on the order of about 50 to 100 tubes arranged in a two dimensional array. The basic function of the PMTs 118 is to detect and amplify the scintillation photons 110A (events).

Each PMT 118 is operable to detect a fraction of the scintillation photons 110A emanating from the scintillation crystal 114 and produce an analog output signal (e.g., a current or voltage pulse) having an amplitude that is proportional to the number of detected scintillation photons 110A. Each PMT 118 includes a light sensitive surface, called the photocathode, which emits electrons in proportion to the number of incident scintillation photons 110A. The emitted electrons, also called photoelectrons, are then electrostatically accelerated into an electron multiplying structure of the PMT 118, which causes an electrical current (or voltage) to be developed at an output of the PMT 118.

The amplitude of the output signal is proportional to the number of photoelectrons generated in the PMT 118 during the time period that scintillation photons 110A are incident. More specifically, the amplitude of the output signal from each PMT 118 is proportional to two basic factors: (i) the number of scintillation photons 110A detected by the PMT 118, and (ii) the gain of the electron multiplying structure of the PMT 118. Thus, after a gamma ray 110 absorption event at the scintillation crystal 114, a given PMT 118 outputs a signal that can be used (with other signals from other PMTs 118) to determine the location of the gamma ray 110 absorption event.

Assuming that the analog output signals from the PMTs 118 are current signals, such output signals are subject to a current-to-voltage conversion to yield an analog voltage signal. The analog voltage signals are then digitalized using analog to digital ("A/D") converters prior to (in the tub) or as an initial stage in the acquisition electronics system 122. The interconnection subsystem 124 communicates the signals from the PMTs 118 to the acquisition electronics system 122. In the preferred embodiment, the signals from the PMTs are analog, and the conversion to digital occurs in the acquisition electronics system 122. Also, gain control signals for the PMTs are provided from the acquisition electronics in digital form. At the PMTs, each such signal is converted to analog form, in order to control the PMT. Thus there is a digital-to-analog converter dedicated to each PMT.

A basic function of the acquisition electronics system 122 is to calculate the spatial location and energy level of the incident gamma rays 110 based on the digitized analog output signals from the PMTs 118. From such location information, the acquisition electronics system 122 is then operable to produce a two dimensional image of the anatomy of a patient, which may be displayed on a CRT or other display mechanism. The number of scintillation photons producing output in each PMT 118 is inversely related to the distance of the PMT 118 from the point of gamma ray absorption, or event location, within the scintillation crystal 114. Thus, the acquisition electronics system 122 uses this relationship to compute the position of the gamma event from the output signals of a number of the PMTs 118 surrounding the event location. Further details regarding the basic operation and structure of the gamma ray detection circuitry of the SPECT scanner 100 may be found in U.S. Patent Application Publication No. US2004/0036026 and/or U.S. Pat. No. 6,124,595, the entire disclosures of which are incorporated herein by reference.

As shown schematically in FIG. 1, the interconnection subsystem 124 provides all the necessary power supply voltages P to each PMT. In the preferred embodiment, the PSU 120 is actually part of the processing subsystem 122. In addition, the interconnection subsystem 124 receives an analog signal A from each PMT. The interconnection subsystem 124 may also receive digitized analog output for each PMT and various other signals from tub 104, or it may provide them to the tub. For example, as explained above, gain control signals for the PMTs are provided from subsystem 122 in digital form, received by the PMTs, and digital-to-analog converters at the PMTs convert them to an analog signal useable by the PMT. The interconnection subsystem 124 then provides communication of the various of the signals between the PMTs and the processing subsystem 122.

Figure 2:
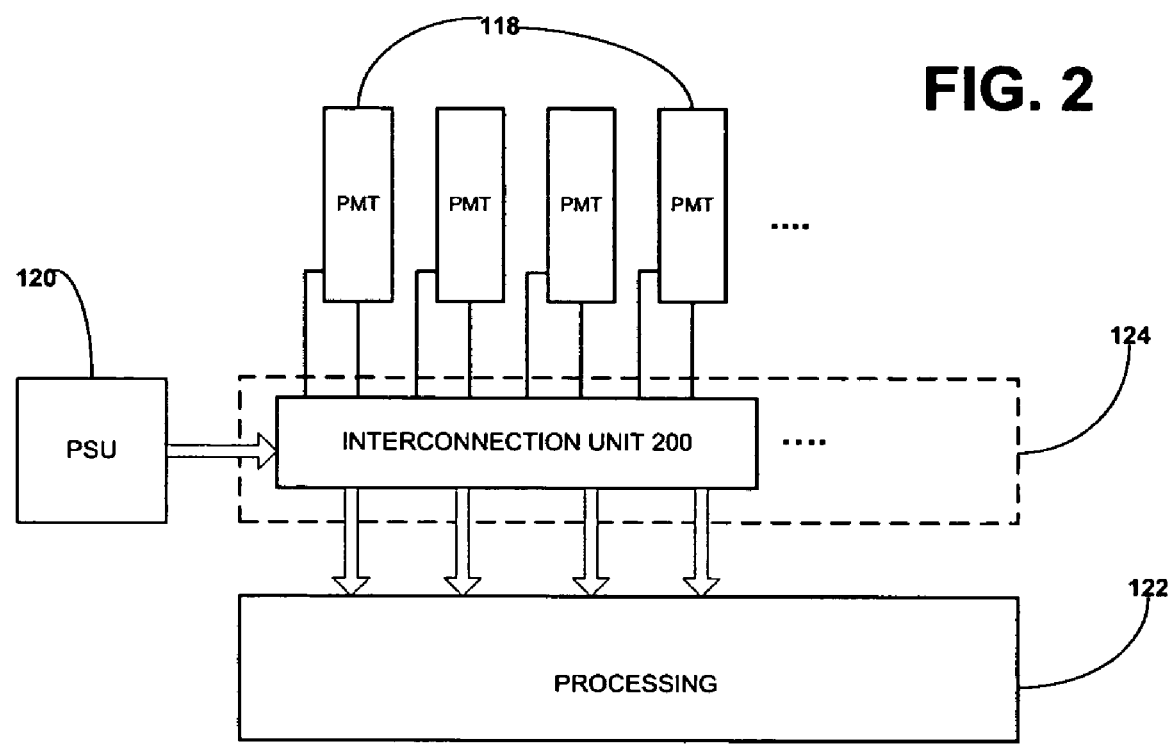
FIG. 2 is a schematic block diagram illustrating how an interconnection subsystem in accordance with an embodiment of the present invention is made up of a plurality of interconnection units, each dedicated to a group of PMTs.

FIG. 2 is a block diagram illustrating further details of a preferred embodiment of interconnection subsystem 124. In this embodiment, interconnection subsystem 124 is made up of a plurality of interconnection units 200, each of which is dedicated to four PMTs. Those skilled in the art will appreciate that an interconnection unit could be dedicated to fewer or more PMTs. The number of interconnection units 200 making up the interconnection subsystem 124 will depend upon the total number of PMTs to be accommodated. FIG. 2 details a single interconnection unit, but it also indicates that others are present. In a preferred embodiment, there are 59 PMTs 118 and each interconnection unit 200 may service either four or five PMTs, for a total of 14 interconnection units 200.

Interconnection unit 200 incorporates a technology for building electronic circuits, called flexible electronics, in which electronic devices are deposited on a flexible substrates such as plastic. In the simplest case, flexible electronics can be made by using many of the same components used for rigid printed circuit boards, with exception of the substrate, is flexible rather than rigid. Flex circuits are often used for connections in various applications where flexibility, space savings, or production constraints limit the serviceability of rigid circuit boards or hand wiring. In addition to cameras, a common application of flex circuits is in computer keyboard manufacturing; most keyboards made today use flex circuits for the switch matrix.

Figure 3:
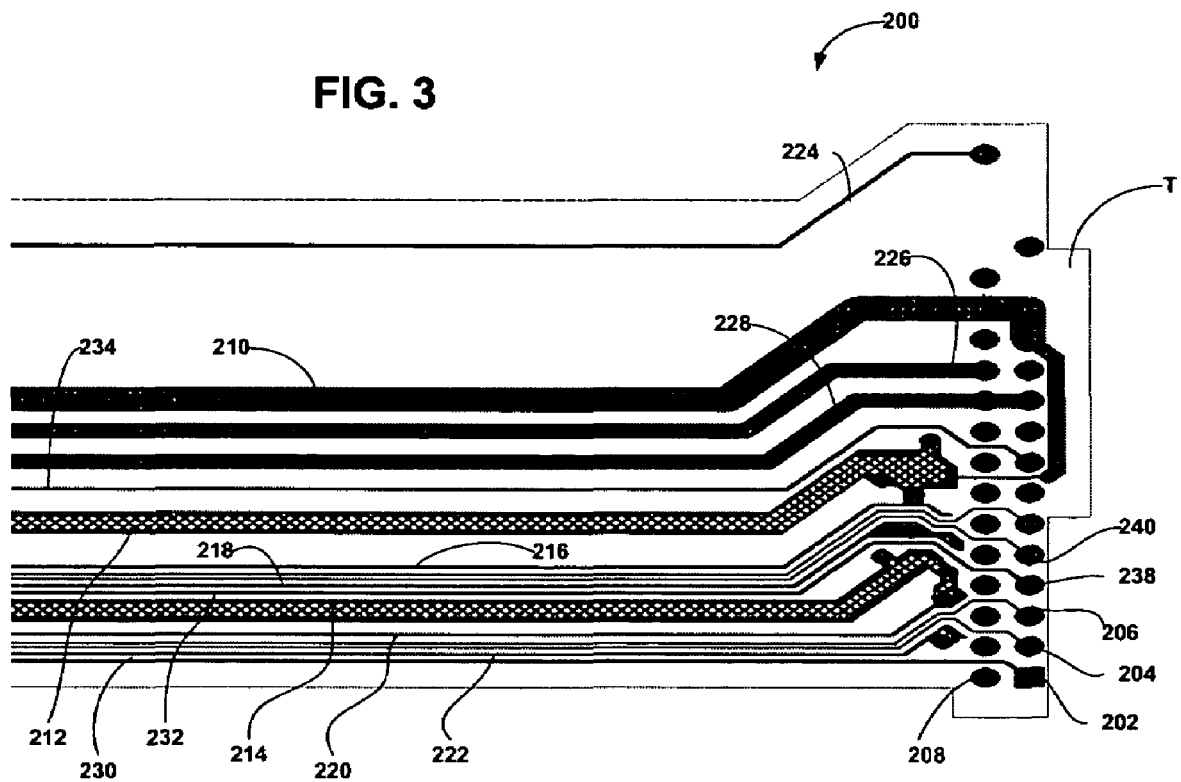
FIG. 3 is a schematic representation of a remote connection and a flexible circuit embodying an interconnection unit in accordance with an embodiment of the present invention, this unit being a two-layer circuit and FIG. 3 representing the first layer of the circuit.
Figure 4:
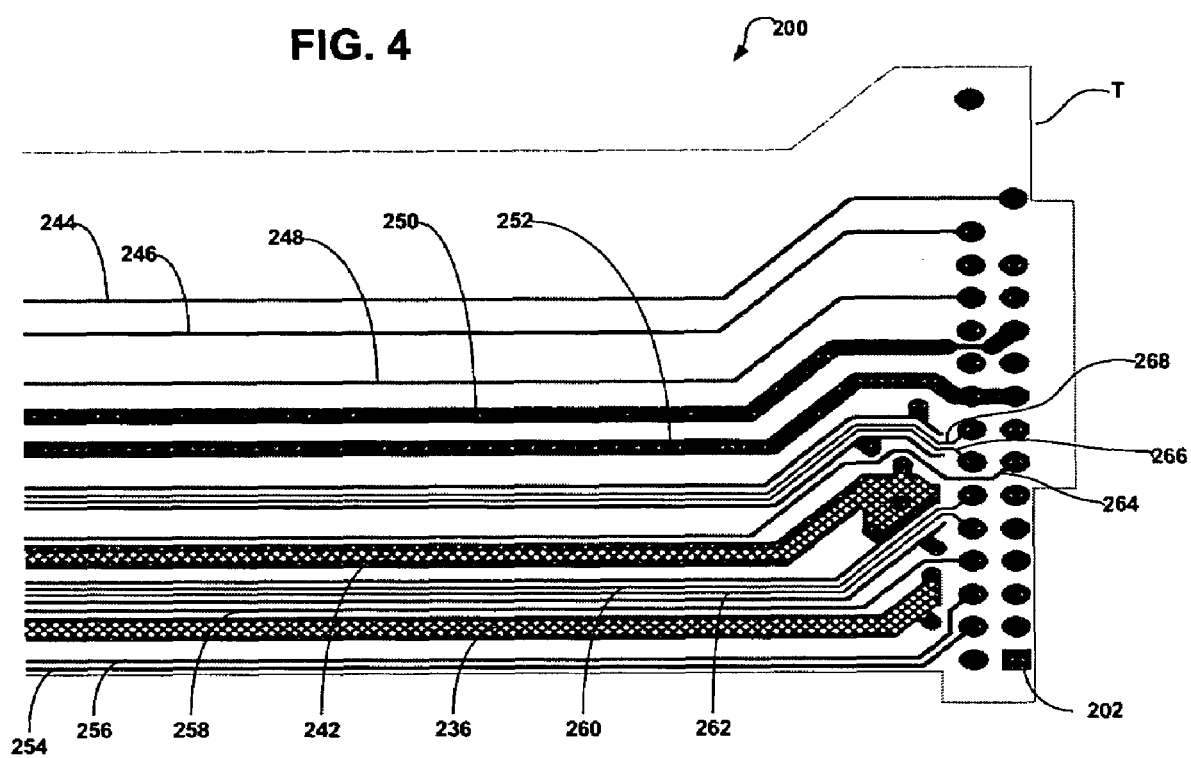
FIG. 4 is a schematic diagram similar to FIG. 5 illustrating the second layer of the flexible circuit.
Figure 5:
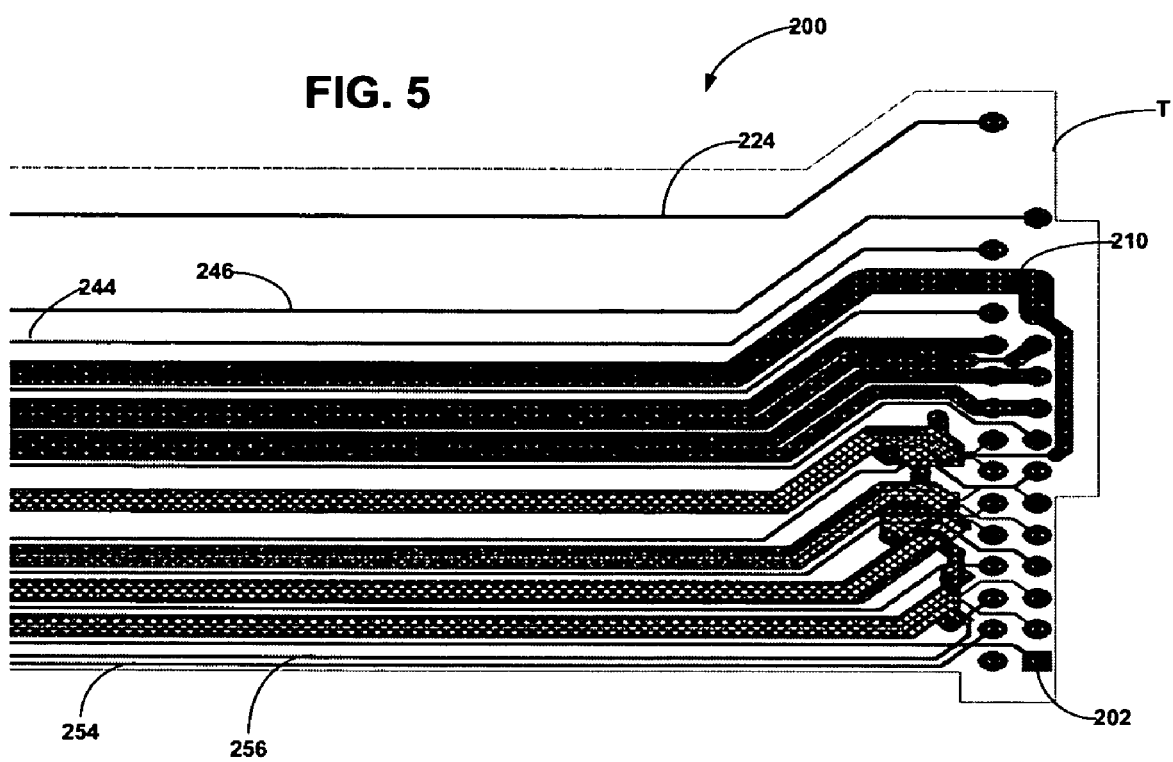
FIG. 5 is a schematic diagram similar to FIG. 3 illustrating the superposition of the two layers of the flexible circuit.

In the preferred embodiment, each interconnection unit is a flexible circuit with a two-layer structure on opposite sides of the flexible circuit, and it may have the general appearance of a ribbon cable. FIGS. 3-5 are schematic representations of the terminal end T of an interconnection unit 200 (the end connected to processing subsystem 122). In this case, FIG. 3 represents the first layer, FIG. 4 represents the second layer and FIG. 5 represents the superposition of the two layers.

In the preferred embodiment, an interconnection unit has 38 pin-out connection points represented by ovals. Pin 1, indicated by the reference character 202, is represented by a rectangle. The odd numbered pins appear above 202 in increasing order. For example, 204 is pin 3 and 206 is pin 5. Pin 2 (208) is immediately to the left of pin 1 and the even numbered pins appear above it in increasing order.

Initially, it should be noted that the first layer has a system of buses which serve all the connected PMTs. The heavy interconnected buses 210, 212 and 214 are part of the grounding system and also serve as a ground plane for underlying conductors that lie on the second layer. Also part of the grounding system are guard conductors (discussed further below), which straddle conductors that carry an RF signal. The guard conductors are provided to contain the RF signal.

Layer 1 also includes a number of power supply buses. For example, bus 224 is a high voltage bus, bus 226 is a 12-volt bus, and bus 228 is a 2.5 volt bus. Conductors 230, 258, 232 and 264, connected to pins 1, 8, 7, and 13, respectively, carry digital signal lines. In the preferred embodiment, these are a series digital signal corresponding to a digitized version of the gain control signal for a PMT. To be used by the PMTs, these digital signals need to be converted to analog (e.g. by a digital-to-analog converter). The conductors connected to pin 3 (204) and pin 5 (206) carry an RF signal from a PMT. This is a balanced signal provided differentially between the two conductors. It should be noted that grounded conductor 220, 222 bounds the RF conductors on each side. In addition, an underlying grounded bus 236 on layer 2 acts as a ground plane for the two RF conductors. In combination, the ground plane and the guard conductors on each side of the RF conductors, serve to minimize radiation from the RF conductors. Similarly, pin 9 (238) and pin 11 (240) connect to a balanced differential pair of RF conductors which are bounded on each side by a grounded guard conductor and from below by a ground plane 242 on layer 2.

Turning to layer 2 (FIG. 4), conductors 244, 252 are power supply buses. Conductor 254 is a temperature sensing line and conductors 256 and 258 are digital lines. Conductors 260 and 262 are an RF differential pair and are bounded on each side by a grounded conductor. In addition, bus 214 on layer 1 serves as a ground plane for these conductors. Similarly, conductor 264 is a digital line and conductors 266 and 268 are a differential RF pair which is bounded on each side by a grounded conductor, and bus 212 on layer 1 serves as a ground plane.

Figure 6:
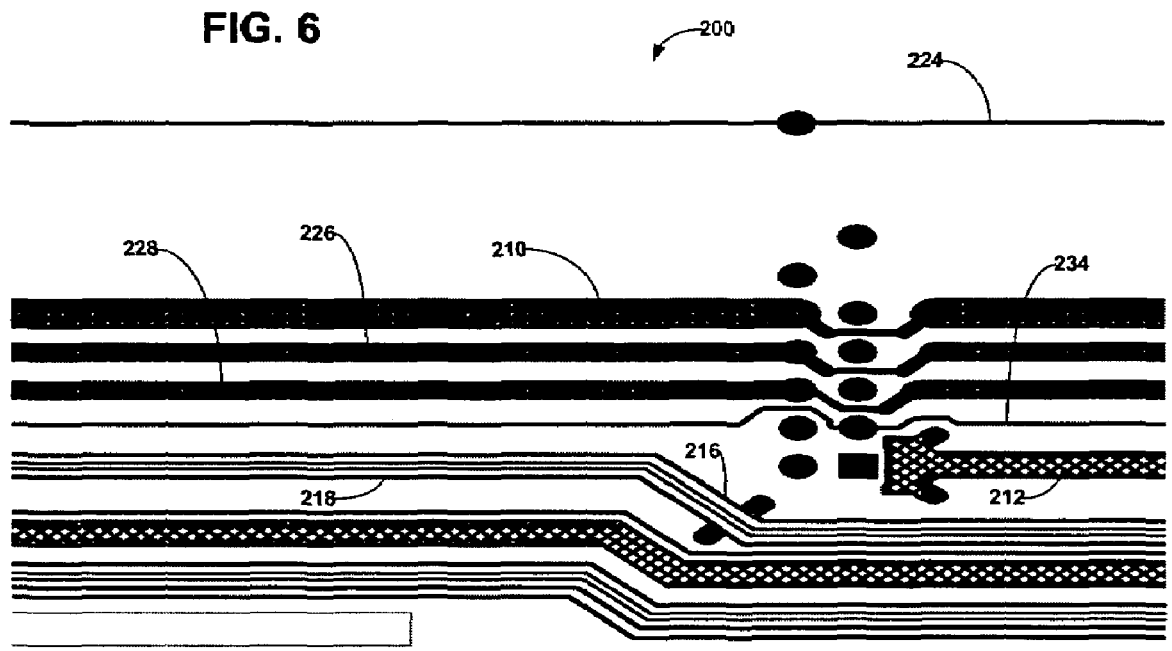
FIG. 6 is a schematic diagram of the flexible circuit of FIG. 3 an immediate point remote from the end connection, at which a connection is made to a PMT, this figure representing the first layer of the flexible circuit.
Figure 7:
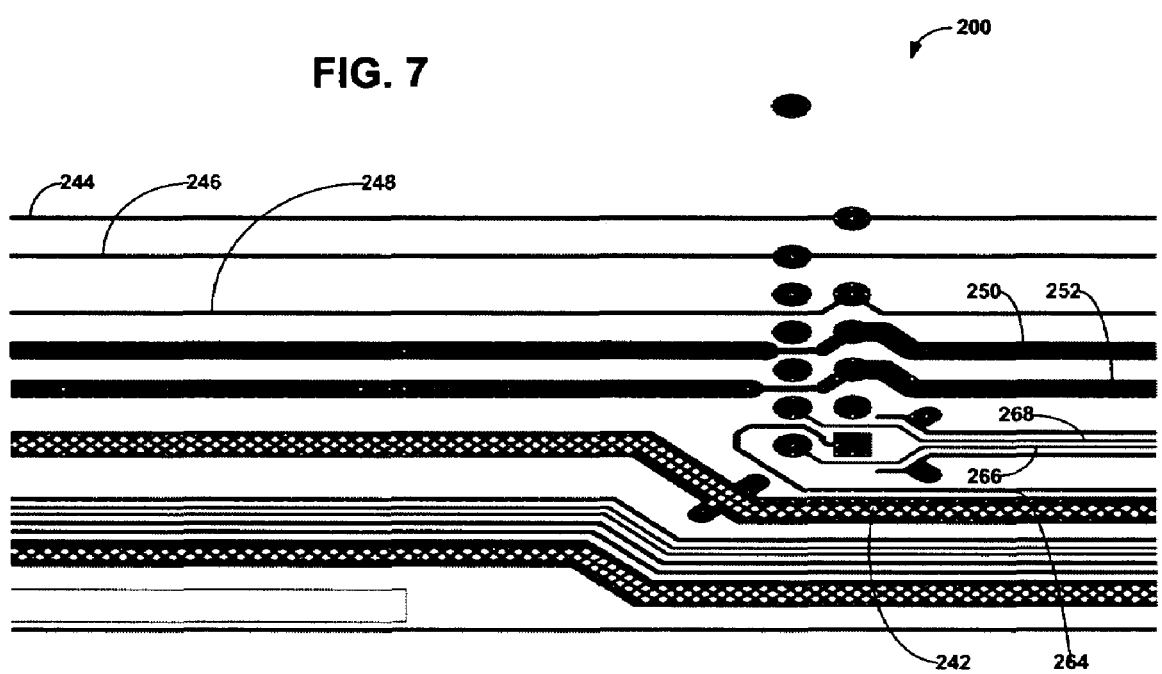
FIG. 7 is a schematic diagram similar to FIG. 6 illustrating the second layer of the flexible circuit.

When superposed, layers 1 and 2 appear as in FIG. 5. As may be seen, in the preferred embodiment, the layout is such that the DC buses are in the upper half of the structure, and the four RF buses are in the lower half, each accompanied by the respective digital gain control signal for the respective PMT (on pins 1, 7, 8 and 11). This arrangement of the buses improves the isolation of the DC buses from the RF signals. It should also be noted that adjacent RF buses are on opposite sides of the flexible circuit, to improve the isolation between RF buses FIG. 6 is a representation of layer 1 and FIG. 7 represents layer 2 of interconnection unit 200 in the vicinity of a connection point for one of the PMTs. At that point, a connector for the PMT is secured to the flex circuit comprising interconnection unit 200 and makes connection to the various pins. Specifically, the connectors connect to power lines 224, 226 and 228 on layer 1, to digital line 234, to the ground bus 210, and to the ground conductors 216, 218. On layer 2, the connector connects to power buses 244-252, to the digital line 264, to the differential pair 266, 268, and to the grounded conductors guarding them, and to the ground bus 242. Preferably, the signal on bus 248 is an analog signal common to all PMTs on the respective flex circuit, and the signal is used to inject arbitrary signals (e.g. DC or RF) into a PMT transimpedance amplifier, in order to check for operational integrity.

Figure 8:
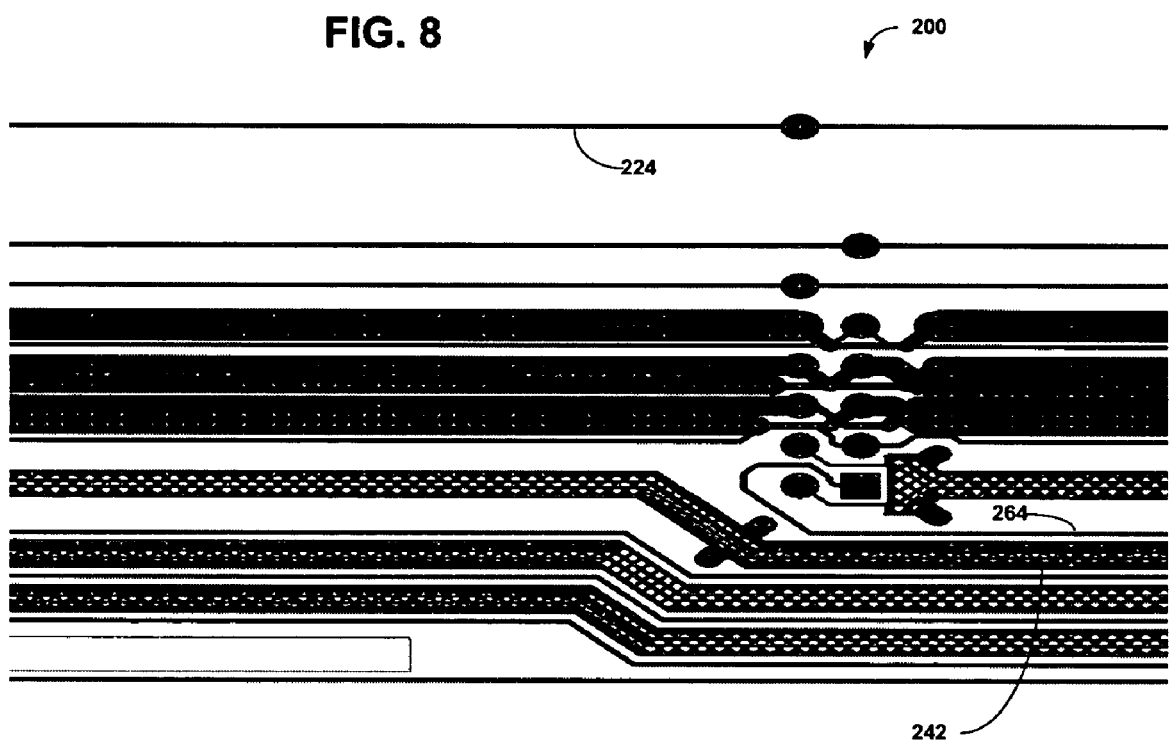
FIG. 8 is a schematic diagram similar to FIG. 6 illustrating the superposition of the first and second layers.

FIG. 8 represents the appearance of interconnection unit 200 of that location, with layers 1 and 2 superposed. It should be noted that the connector for a PMT connects to all of the power line buses on each layer. In addition, it connects to a dedicated differential pair, with its guard conductors, and dedicated ground plane bus (an RF bus unit) and a dedicated digital line. The particular PMT involved is the one closest to terminal end T. Additional PMT connectors are provided at locations progressively further away from terminal end T. It should be noted that the RF bus and digital line for the closest PMT are closest to the center of the flexible circuit, whereas those for progressively further PMTs are located progressively closer to the margin of the flexible circuit. This permits a particularly compact and efficient layout for the flexible circuit.

Although not specifically mentioned, it will be appreciated that unit 200 must also have a connector for power supply unit 120, in order to power the various voltage supply buses. Since power supply unit 120 is located in processing subsystem 122, this could be provided, for example, at the end of the flexible circuit illustrated in FIGS. 3-5 as part of the end connector.

Although preferred exemplary embodiments of the invention have been disclosed for illustrative purposes, those skilled in the art will appreciate that many additions, modifications and substitutions are possible without departing from the scope and spirit of the invention as defined by the accompanying claims.

What is claimed:

1. An interconnection unit communicating diverse electrical signals to and from a utilization device, the signals including an RF signal, the unit comprising:

a support body having a differential pair of adjacent conductive surface elements formed on a first layer thereof, the pair carrying the RF signal thereon differentially in balanced form;

a pair of grounded, conductive surface guard elements on the first layer straddling the differential pair; and a grounded surface conductor on a second layer of the support body aligned with and extending along the differential pair and the guard conductors.

2. The interconnection unit of claim 1 wherein the differential pair is connected between a first connector adapted to be connected to a utilization device and a second connector adapted to be connected to a source device.

3. The interconnection unit of claim 2 wherein the second connector is adapted to be connected to a photomultiplier tube (PMT) of a nuclear scanner and the first connector is adapted to be connected to the acquisition electronics for the scanner.

4. The interconnection unit of claim 2 wherein one of said layers further comprises a conductive power bus surface element connected to carry a supply voltage required by the source device.

5. The interconnection unit of claim 4 further comprising the first connector being adapted to be connected to a power supply voltage source, the power bus surface element being connected between the first and second connectors.

6. The interconnection unit of claim 5 wherein the second connector is adapted to be connected to a photomultiplier tube (PMT) of a nuclear scanner and the first connector is adapted to be connected to the acquisition electronics for the scanner.

7. The interconnection unit of claim 6 wherein the first connector is adapted to be connected to one of a high voltage PMT bias supply and low voltage power supply for electronics used by the PMT.

8. The interconnection unit of claim 2 wherein one of said layers further comprises a conductive communication surface element connected to carry a digital communication signal between the source device and the utilization device.

9. The interconnection unit of claim 8 wherein the communication element is connected between the first and second connectors.

10. The interconnection unit of claim 9 wherein the second connector is adapted to be connected to a photomultiplier tube (PMT) of a nuclear scanner and the first connector is adapted to be connected to the acquisition electronics for the scanner.

11. The interconnection unit of claim 10 wherein there is a digital-to-analog converter collocated with the PMT, the communication element carrying a serialized version of a digital input to the digital-to-analog converter.

12. The interconnection unit of claim 1, further comprising:

an additional differential pair of adjacent conductive surface elements formed on one of said layers, the additional pair carrying an additional RF signal thereon differentially in balanced form; and an additional pair of grounded, conductive surface guard elements on the same layer as the additional differential pair, the additional guard elements straddling the differentially pair.

13. The interconnection unit of claim 12 wherein the differential pair and the additional differential pair are on different layers.

14. The interconnection unit of claim 12 wherein the differential pair and additional differential pair extend along a length of the interconnection unit and are located in the same widthwise half thereof.

15. The interconnection unit of claim 14 wherein the additional differential pair is closer than the differential pair to a widthwise margin of the interconnection unit.

16. The interconnection unit of claim 15 wherein the differential pair is connected between a second connector adapted to be connected to a source device and the first connector adapted to be connected to a utilization device, and the additional differential pair is connected between a third connector adapted to be connected to an additional source device and the first connector, the second connector being closer to the first connector than is the third connector 17. The interconnection unit of claim 12 wherein the additional differential pair is connected between a third connector adapted to be connected to an additional source device and a first connector adapted to be connected to a utilization device.

18. The interconnection unit of claim 16 wherein the differential pair is connected between a second connector adapted to be connected to a source device and the first connector.

19. The interconnection unit of claim 18 wherein the second and third connectors are adapted to be connected to a photomultiplier tube (PMT) of a nuclear scanner and the first connector is adapted to be connected to the acquisition electronics for the scanner.

20. The interconnection unit of claim 12 wherein one of said layers further comprises a conductive power bus surface element connected to carry a supply voltage required by the source device or the additional source device.

21. The interconnection unit of claim 12 further comprising the first connector being adapted to be connected to a power supply voltage source, the power bus surface element being connected between the first and second connectors.

22. The interconnection unit of claim 21 wherein the second and third connectors are adapted to be connected to a photomultiplier tube (PMT) of a nuclear scanner and the first connector is adapted to be connected to the acquisition electronics for the scanner.

23. The interconnection unit of claim 22 wherein the first connector is adapted to be connected to one of a high voltage PMT bias supply and low voltage power supply for electronics used by the PMT.

24. The interconnection unit of claim 12 wherein one of said layers further comprises a conductive communication surface element connected to carry a digital communication signal between the utilization device and one of the source device or the additional source device.

25. The interconnection unit of claim 24 wherein the communication element is connected between the first connector and one of the second and third connectors.

26. The interconnection unit of claim 25 wherein the second connector is adapted to be connected to a photomultiplier tube (PMT) of a nuclear scanner and the first connector is adapted to be connected to the acquisition electronics for the scanner.

27. The interconnection unit of claim 26 wherein there is a digital-to-analog converter collocated with the PMT, the communication element carrying a serialized version of a digital input to the digital-to-analog converter.

28. An interconnection unit communicating electrical signals between a plurality of source devices and a utilization device, the signals including an RF signal, the unit comprising:

an elongate support body having a plurality of conductive bus structures extending therealong, each dedicated to one of the source devices and a conductive bus structure shared by the source devices, the dedicated bus structures being disposed side-by-side in a predefined widthwise portion of the support body;

a connection for the utilization device at a terminal end of the support body;

a connection for each dedicated bus structure spaced from the terminal end, the connection for the widthwise innermost dedicated bus structure being closest to the terminal end, and the distance of a remaining dedicated bus structure connections from the terminal being related to the distance of the remaining dedicated bus structure from the innermost dedicated bus structure.

29. The interconnection unit of claim 28 wherein the unit has two layers and one of the dedicated busses comprises:

a differential pair of adjacent conductive surface elements formed on a first layer thereof, the pair carrying the RF signal thereon differentially in balanced form;

a pair of grounded, conductive surface guard elements on the first layer straddling the differential pair; and a grounded surface conductor on the second layer aligned with and extending along the differential pair and the guard conductors.

30. The interconnection unit of claim 28 wherein the unit has two layers, the widthwise innermost dedicated bus being on a first layer and the remaining dedicated buses thereafter being disposed alternately on opposite layers.

31. The interconnection unit of claim 28 wherein the interconnection unit is formed as a flexible circuit and the connectors comprise connection access points on the flexible circuit.

* * * * *